United States Patent [19]

Kushida et al.

[11] Patent Number: 4,803,392

[45] Date of Patent: Feb. 7, 1989

[54] PIEZOELECTRIC TRANSDUCER

[75] Inventors: Keiko Kushida, Kunitachi; Hiroshi Takeuchi, Matsudo; Toshio Kobayashi, Tokyo; Kazumasa Takagi, Tokyo; Kenzo Susa, Tokyo, all of Japan

[73] Assignee: Hitachi, Ltd., Tokyo, Japan

[21] Appl. No.: 86,488

[22] Filed: Aug. 18, 1987

[30] Foreign Application Priority Data

Sep. 26, 1986 [JP] Japan .................. 61-225935

[51] Int. Cl.$^4$ ........................................... H01L 41/08
[52] U.S. Cl. ................................... 310/311; 310/334; 310/366; 310/360
[58] Field of Search ............... 310/334–336, 310/365, 366, 311, 360, 358, 313 R, 313 B

[56] References Cited

U.S. PATENT DOCUMENTS

| | | | |
|---|---|---|---|
| 3,688,222 | 8/1972 | Lieberman | 310/366 X |
| 4,117,074 | 9/1978 | Tiersten et al. | 310/334 X |
| 4,236,095 | 11/1980 | Ono et al. | 310/313 A |
| 4,484,098 | 11/1984 | Cullen et al. | 310/313 A |
| 4,511,816 | 4/1985 | Mikoshiba et al. | 310/313 A |
| 4,567,393 | 1/1986 | Asai et al. | 310/313 A |

Primary Examiner—Mark O. Budd
Attorney, Agent, or Firm—Antonelli, Terry & Wands

[57] ABSTRACT

There is provided a piezoelectric transducer comprising a substrate having a single crystal plate comprising strontium titanate or magnesium oxide, a first electrode comprising metal films so formed on the substrate as to leave openings exposing the surface of the substrate, a piezoelectric thin film comprising lead titanate as the main component formed so as to cover the openings and the first electrode, and a second electrode formed on the piezoelectric thin film.

18 Claims, 4 Drawing Sheets

PIEZOELECTRIC TRANSDUCER

BACKGROUND OF THE INVENTION

The present invention relates to a transducer using a thin film of piezoelectric material and in particular to a transducer using a lead titanate ($PbTiO_3$) thin film having an excellent piezoelectric property.

Lead titanate $PbTiO_3$ has a large crystal lattice anisotropy and a large spontaneous polarization Ps in the ferroelectric phase (in the tetragonal system). It also has a very large piezoelectricity and a very large pyroelectricity in the polarization axis (c-axis). A piezoelectric transducer using the lead titanate is disclosed in copending U.S. patent application Ser. No. 824,728 filed on Jan. 31, 1986 and entitled "Piezoelectric Transducer and process for its production". When a thin film is formed by applying the sputtering method or the like to lead titanate $PbTiO_3$, a polycrystalline film having random crystal axes is generated. Accordingly the property of lead titanate PbTiO that the piezoelectricity in the c-axis direction is large is not sufficiently achieved.

On the other hand, it is known to make a lead titanate thin film epitaxially grow on a single crystal substrate made of MgO, for example. In order to use the $PbTiO_3$ thin film as a piezoelectric device or a pyroelectric device, however, it is necessary to dispose an electrode on the underlayer. Therefore, it was attempted to dispose at first an electrode film by using a single crystal substrate and dispose a piezoelectric film thereon.

For example a (100)-oriented platinum thin film is formed on a MgO single crystal substrate, and a c-axis oriented $PbTiO_3$ thin film is formed on this electrode as described in Japanese patent laid-open application JP-A-59-123285 (1984) or Journal of Applied Physics Vol. 60, No. 1, Pages 361-367 (1986). When this method is used, a c-axis oriented $PbTiO_3$ thin film is obtained. Since the Pt film is disposed as the intermediate layer, however, the property deterioration is inevitable as compared with the case where the $PbTiO_3$ thin film is formed directly on the single crystal substrate.

SUMMARY OF THE INVENTION

An object of the present invention is to provide a piezoelectric transducer having such a structure that a piezoelectric thin film having excellent orientation can be formed and thereby a high effective sensitivity can be obtained.

Another object of the present invention is to provide a piezoelectric transducer having a resonance frequency of 10 to 100 MHz which is hardly attainable with piezoelectric ceramics and having a high effective sensitivity.

In accordance with the present invention, a piezoelectric transducer comprises a substrate made of a single crystal having a lattice constant substantially equal to that of a perovskite-type piezoelectric crystal, such as strontium titanate ($SrTiO_3$), magnesium oxide (MgO) or the like, a first electrode of a metal film formed on one of main surfaces of the substrate and having openings where the surface of the substrate is exposed, a piezoelectric thin film having a perovskite-type crystal structure so formed as to cover the first electrode and the openings, and a second electrode formed on the piezoelectric thin film.

The above described piezoelectric thin film typically comprises lead titanate $PbTiO_3$ as the main component and is formed by the high frequency sputtering method. At the opening where the single crystal substrate is exposed, c-axis oriented crystals grow epitaxially at first. Shortly over the first electrode as well, crystals oriented in the same direction as that of crystals of the opening are laminated with crystals of the opening taking as seeds. As a result, a piezoelectric film having c-axis orientation as a whole, i.e., a piezoelectric film having high piezoelectricity and high pyroelectric property is obtained.

Further, it is possible to obtain a piezoelectric thin film having more excellent c-axis orientation by embedding the first electrode into grooves formed in the single crystal substrate at intervals and by epitaxially growing the piezoelectric thin film on the substrate.

BRIEF DESCRIPTION OF THE DRAWINGS

FIG. 1B is a sectional view along 1B—1B in

DESCRIPTION OF THE PREFERRED EMBODIMENTS

Embodiments of the present invention will now be described.

Figure 1A:
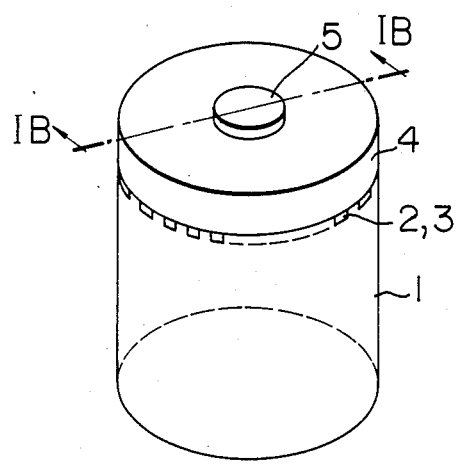
FIG. 1A is a perspective view of an embodiment of the present invention.
Figure 1B:
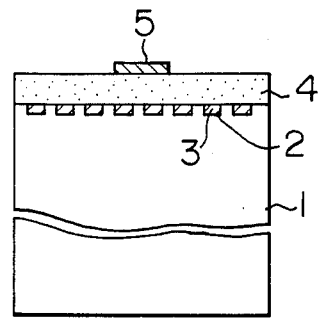

FIG. 1A shows a perspective view of a piezoelectric transducer according to the present invention, while FIG. 1B shows a sectional view along IB—IB in FIG. 1A.

In FIGS. IA and IB, numeral 1 denotes a single crystal rod comprising strontium titanate. On the upper face of the rod 1, a number of linear and parallel grooves 2 having width of 1 $\mu$m and depth of approximately 100 nm are formed at intervals of approximately 1 $\mu$m. Within these grooves, a first electrode comprising platinum is formed. Over the top face of the rod 1, a piezoelectric thin film 4 comprising lead titanate $PbTiO_3$ as the main component and having thickness of approximately 2 $\mu$m is formed. On the piezoelectric thin film 4, an upper electrode 5 comprising chrome and a gold film is disposed. All portions of the above described first electrodes 3 are externally connected in common. Alternatively, the grooves 2 may be disposed lengthwise and breadthwise and the electrodes 3 may be mutually connected inside the rod 1.

The fabrication method of this piezoelectric transducer will now be described in detail. A rod having a diameter of 10 mm and a length of 10 mm is made of (100)-oriented single crystal of strontium titanate and its one end face undergoes optical polishing. Then, a resist pattern is so formed on the end face by using the photolithography technique as to have lines of 1 $\mu$m in width and have spaces of 1 $\mu$m in width. By using ion milling with the resist taken as the mask, grooves 2 having depth of 100 nm are formed. After platinum films 3 have been deposited by using the evaporation method, the resist is removed. As a result, the electrode is so formed as to fill up the grooves 2.

Subsequently on the platinum electrode film pattern 3, the lead titanate ($PbTiO_3$) thin film 4 is formed as the piezoelectric substance by rf-magnetron sputtering. The sputtering is performed under the condition that the temperature of the substrate, the pressure of $Ar-O_2$ gas (90 to 10%) and the thickness of the formed film are 600° C., 3 Pa and approximately 20 μm, respectively. As a result of x-ray diffraction, strong peaks of (00l) appear, resulting in a c-axis oriented film. The letter l represents 1, 2 and 3.

Subsequently on the lead titanate thin film 4, chrome (Cr) and gold (Au) are vapor-deposited to form the upper electrode. While keeping the temperature of the sample at 150° C., direct current voltage of 100 KV/cm is applied between both electrodes for 10 minutes to perform the polarization processing.

The sensitivity of the piezoelectric transducer fabricated by the above described method was measured by using the pulse echo method. That is to say, electrical burst waves were applied between both electrodes to produce ultrasonic waves. The intensity of the echo reflected by the other end face of cylindrical strontium titanate was measured in the frequency range of 0.1 to 1.2 GHz. The electromechanical coupling coefficient calculated from the resultant frequency characteristics was 0.6. This value is larger than the value (0.50) of ceramics, the effect of c-axis orientation of lead titanate being indicated.

Another example of transducer forming will now be described. After a platinum film pattern has been formed by the above described method, a lead titanate thin film is formed by the rf-magnetron sputtering method. The sputtering is performed under the condition that the pressure of the introduced gas (Ar: 90%, $O_2$: 10%) and the temperature of the substrate are 3 Pa and 200° C., respectively. As a result of estimation using x-ray diffraction, significant diffraction lines do not appear, indicating that the film is amorphous. Its heat treatment at 600° C. for 8 hours generated strong diffraction lines of (00l) and weak diffraction lines of (h00). It was thus found that the heat treatment caused c-axis oriented crystallization This method provides a lead titanate thin film which is excellent in crystalline property as compared with the case of high temperature sputtering. If the film thickness is increased, however, polycrystallization is caused. At first, therefore, an amorphous thin film undergoes heat treatment to be transformed into a single crystal. Thereafter, sputtering is performed until a desired thin film is obtained while keeping the substrate at a high temperature.

A piezoelectric transducer was actually formed by this method. On a platinum electrode film pattern, a lead titanate thin film with thickness of 300 nm was formed as an amorphous film at first. The lead titanate thin film underwent heat treatment at 600° C. for 8 hours to be transformed into a single crystal Thereafter, sputtering was performed at substrate temperature of 550° C. for 10 hours to form a lead titanate thin film with thickness of approximately 3 μm. As a result of estimation using the x-ray diffraction method, very strong diffraction lines of (00l) and weak diffraction lines of (h00) appeared.

Further, the top electrode 5 was formed and polarization processing was performed. By using a method similar to that of the preceding embodiment, the sensitivity of the transducer was estimated. The 0.65. By using this method, a transducer having a higher sensitivity can be formed.

Figure 2A:
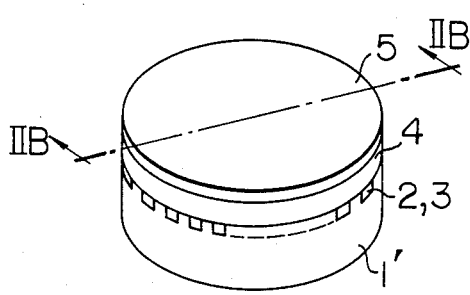
FIG. 2A is a perspective view of another embodiment of the present invention.
Figure 2B:
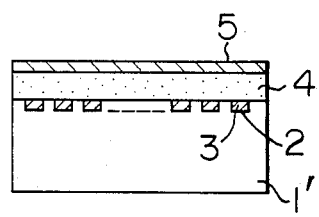
FIG. 2B is a sectional view along IIB—IIB in FIG. 2A

FIGS. 2A and 2B show a piezoelectric transducer using composite resonance which can be fabricated in the same way as the piezoelectric transducer illustrated in FIGS. 1A and 1B. Unlike the transducer of FIGS. 1A and 1B, a single crystal plate having thickness of 0.1 mm and diameter of 3 mm and comprising strontium titanate is used as a substrate 1'. Both faces of this single crystal plate are optically polished. Other reference numerals denote the same components as those of FIGS. 1A and 1B having the same numerals. Owing to the composite resonance between the piezoelectric thin film and the substrate, a piezoelectric transducer using such a thin single-crystal substrate is able to have resonance frequencies which can be obtained neither in thin film piezoelectric transducers nor in transducers using conventional piezoelectric ceramics.

Figure 3:
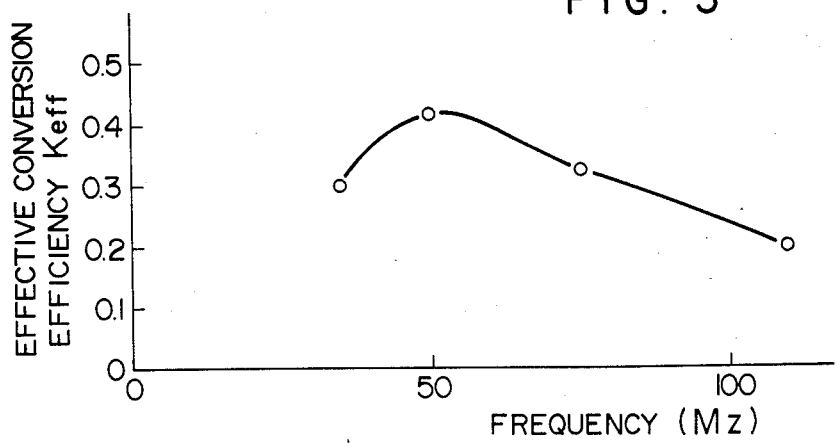
FIG. 3 shows a plot of characteristics of the embodiment illustrated in FIG. 2A.

FIG. 3 shows measurements of effective coupling coefficients of a composite resonator with respect to the first to fourth modes. At the second mode, the value of keff exceeds 0.4, resulting in a practical sensitivity.

In the above described embodiment, the single crystal substrate comprises strontium titanate. Alternatively, other single crystal substrates comprising magnesium oxide (MgO) or the like capable of epitaxially growing lead titanate may be used. As the electrode material, a metal withstanding a temperature close to 600° C. such as palladium (Pd), iridium (Ir), rhodium (Rh) or tungsten (W) may be used.

Figure 4A:
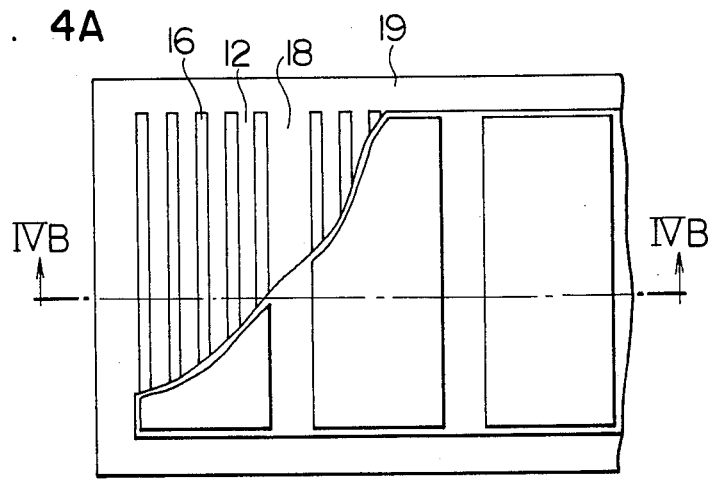
FIGS. 4A and 5A are plane views of further embodiments of the present invention.
Figure 4B:
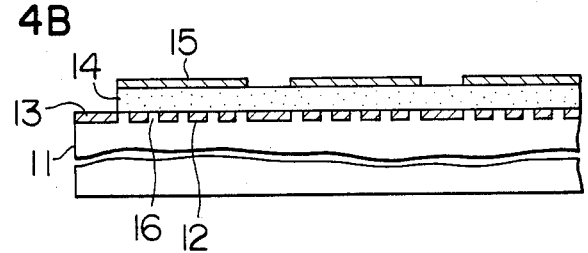
FIGS. 4B and 5B are sectional views along IVB13 IVB in FIG. 4A and VB—VB in FIG. 5A, respectively.

FIGS. 4A and 4B are a plane view and a sectional view of a further embodiment, respectively. This embodiment is an array-type piezoelectric transducer. On a surface of a substrate 11 comprising a single crystal plate of strontium titanate, grooves 12 are disposed at constant intervals in the region corresponding to the transducer device. As a result, the original substrate surface 16 remains in a stripe form. In separation regions 18 between devices and peripheral portions, the substrate surface is shaved by ion milling to the same depth as that of the above described grooves 12. Platinum is embedded in the grooves 12. In the same way, platinum is also formed in the separation regions 18 and the peripheral regions 19 to form a lower electrode 13. Over the lower electrode 13, a lead titanate thin film 14 is laminated. Further, portions of an upper electrode 15 are formed for respective transducer regions.

Figure 5A:
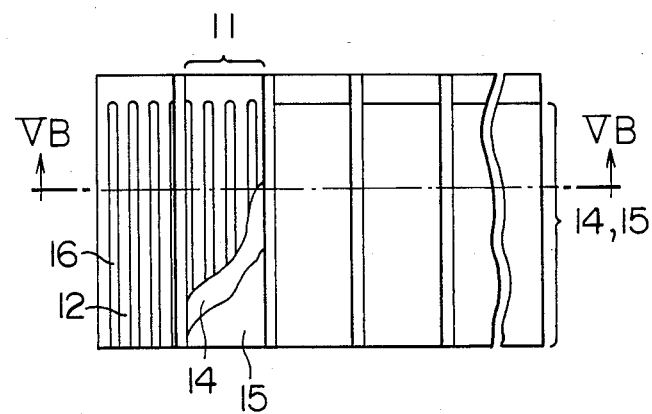
Figure 5B:
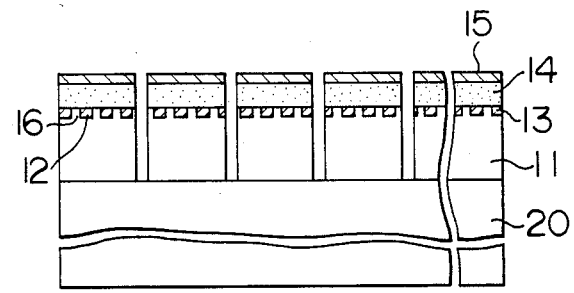

FIGS. 5A and 5B are a plane view and a sectional view of an arrayed transducer using composite resonance. The transducer illustrated in FIGS. 5A and 5B differs from that illustrated in FIGS. 4A and 4B in that a substrate 11 comprising a strontium titanate single crystal and a lead titanate thin film 14 are also divided into portions corresponding to respective elements. These divided elements are arranged on a backing material 20. This structure is obtained by successively etching an upper electrode 15, a lead titanate thin film 14 and a strontium titanate substrate 11 by means of reactive ion etching.

Figure 6:
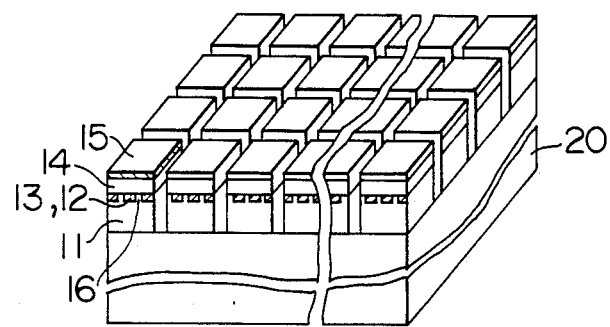
FIG. 6 is a perspective view of a further embodiment.

Further, it is also possible to form a two-dimensional arrayed transducer shown in FIG. 6 by altering the mask pattern for the above described etching.

Figure 7:
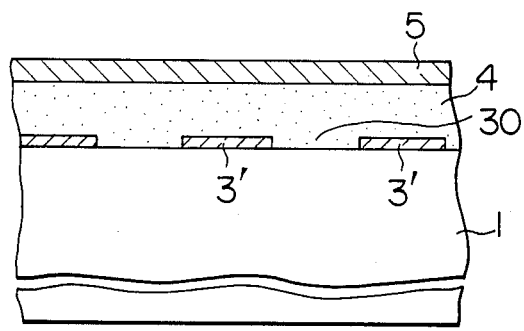
FIG. 7 is a sectional view of a further embodiment.

In any of the above described embodiments, platinum is embedded into grooves disposed on the surface of a single crystal substrate to form the first electrode. If the electrode is formed while remaining an opening where the single crystal substrate is exposed, however, it is possible to epitaxially grow a lead titanate thin film by using the opening as the seed of the crystal growth. In the same way as the above described embodiments, it is thus possible to obtain a c-axis oriented lead titanate thin film without using the embodiment structure. FIG. 7 is a sectional view of an embodiment having no embedded electrodes.

In FIG. 7, numeral 1 denotes a single crystal substrate comprising strontium titanate or the like, numeral 3' a first electrode formed on the substrate in a stripe form, numeral 30 an opening where the substrate is exposed, numeral 4 a thin film comprising lead titanate as the main component, and numeral 5 denotes an upper electrode.

On (100)-oriented face of the strontium titanate single crystal 1, electrode platinum was vapor-deposited to form thickness of approximately 50 nm. Further, a resist pattern comprising lines having thickness of 1 μm and spaces having thickness of 1 μm was formed by a photolithography method. At first, the platinum film was etched by using freon $CF_4$ gas and reactive ion etching. Subsequently in oxygen plasma, the resist was removed to form a pattern 3' of a platinum film. The platinum film pattern can also be made by the lift-off method, i.e., by vapor-depositing a Pt film on a preformed resist pattern and thereafter removing the resist Subsequently, a thin film having thickness of 150 nm and comprising lead titanate as the main component was formed by the rf-magnetron sputtering method. The thin film was made under the condition that the substrate temperature was 200° C. and the pressure of the introduced gas (Ar: 90%, $O_2$: 10%) was 4 Pa. As a result of estimation of this film by using x-ray diffraction, the diffraction peak did not appear. It was thus found that this film was amorphous. Subsequently, this film underwent heat treatment and crystallization and thereafter underwent estimation using x-ray diffraction again. As a result, strong (001) peaks as well as ( 002) and (003) peaks appeared. It was thus found that the film was c-axis oriented. Further on this thin film, a lead titanate thin film was so formed as to have thickness of approximately 3 μm by rf sputtering under the condition that the substrate temperature was 550° C. and the gas pressure was 4 Pa in the same way as the preceding step. As a result of estimation of the film using x-ray diffraction again, intensities of (001), (002) and (003) increased and other diffraction lines did not appear. As a result of further estimation using a reflected high energy electron beam diffraction method, a spotlike pattern appeared. It was thus confirmed that a uniformly oriented film was obtained.

Subsequently, chrome (Cr) and gold (Au) were vapor-deposited to form an upper electrode by using a mask of 5 mmφ. While keeping the temperature of the sample at 200° C., direct current voltage of 100 KV/cm was applied between both electrodes for 20 minutes to perform polarization processings. The intensity of the echo reflected by the other end face of the cylindrical strontium titanate was measured in the frequency range of 0.1 to 0.2 GHz. The electromechanical coupling coefficient calculated from the resultant frequency characteristics was 0.65. It exceeds the value 0.5 of the coupling coefficient of lead titanate ceramics. It is considered that the effect of forming a c-axis oriented film on the platinum electrode as well by lateral epitaxis has been obtained.

Further, a thin film having a desired film thickness may be formed by forming a lead titanate thin film to such a degree that the electrode is covered and thereafter repeating steps for forming an amorphous film having appropriate thickness and for applying heat treatment.

We claim:

1. A piezoelectric transducer comprising:
   a substrate of a single crystal having a lattice constant substantially equal to that of a perovskite-type piezoelectric crystal, said substrate having a number of grooves formed on a main surface of
   said substrate at intervals;
   a first electrode comprising metal formed within said grooves of the substrate;
   a piezoelectric thin film of said perovskite-type piezoelectric crystal so formed as to cover said main surface of said substrate and said first electrode within said grooves; and
   a second electrode formed on said piezoelectric thin film.

2. A piezoelectric transducer according to claim 1, wherein said first electrode comprises platinum (Pt).

3. A piezoelectric transducer according to claim 1, wherein said piezoelectric thin film comprises lead titanate ($PbTiO_3$) as the main component, and said substrate is selected from the group consisting of strontium titanate and magnesium oxide.

4. A piezoelectric transducer according to claim 1, wherein said piezoelectric thin film comprises a film formed by rf sputtering.

5. A piezoelectric transducer according to claim 1, wherein said piezoelectric film comprises a piezoelectric film formed by rf sputtering and comprising lead titanate ($PbTiO_3$) crystallized by heat treatment as the main component.

6. A piezoelectric transducer according to claim 1, wherein said transducer is a composite resonator.

7. A piezoelectric transducer according to claim 1, wherein said piezoelectric thin film comprises lead titanate.

8. A piezoelectric transducer according to claim 1, wherein said piezoelectric thin film is an epitaxial piezoelectric thin film grown on the substrate.

9. A piezoelectric transducer according to claim 1, wherein a plurality of the first and second electrodes are provided so as to form an arrayed transducer having a plurality of transducer regions on the substrate.

10. A piezoelectric transducer according to claim 9, wherein said grooves include a first set of grooves and a second set of grooves, the second set of grooves acting to form separation regions between the transducer regions.

11. A piezoelectric transducer according to claim 9, wherein said substrate is provided on a backing material, and wherein said substrate has further grooves extending through the entire thickness of the substrate to divide the substrate into a plurality of substrate portions, the substrate portions having said number of grooves formed at intervals.

12. A piezoelectric transducer according to claim 1, wherein he piezoelectric thin film has c-axis orientation as a whole.

13. A piezoelectric transducer comprising:
   a substrate having a single crystal plate comprising strontium titanate or magnesium oxide;
   a first electrode comprising metal films so formed on one main surface of said substrate as to leave openings exposing the main surface of said substrate;

a piezoelectric thin film having a perovskite-type crystal structure so formed as to cover said openings exposing the main surface and said first electrode; and a second electrode formed on said piezoelectric thin film.

14. A piezoelectric transducer according to claim 13 wherein said first electrode comprises a platinum (Pt) film.

15. A piezoelectric transducer according to claim 13, wherein said piezoelectric thin film comprises lead titanate ($PbTiO_3$) as the main component.

16. A piezoelectric transducer according to claim 15, wherein said piezoelectric thin film comprises a thin film containing lead titanate as the main component and said thin film is obtained by applying heat treatment for crystallization to an amorphous film formed to have such thickness as to cover said first metal film and thereafter growing the crystal to a desired thickness.

17. A piezoelectric transducer according to claim 16, wherein said amorphous film and said single crystal film are formed by rf sputtering.

18. A piezoelectric transducer according to claim 13, wherein said transducer is a composite resonator.

* * * * *